United States Patent [19]
Ricketson et al.

[11] Patent Number: 5,238,174
[45] Date of Patent: Aug. 24, 1993

[54] SMART INDEXING HEAD FOR UNIVERSAL LEAD FRAME WORK STATION

[75] Inventors: Tommy H. Ricketson, Danboro; Gautam N. Shah, Norristown; Bruce M. Bram, Perkasie; Mohmod M. Tehrani, Paoli, all of Pa.

[73] Assignee: Kulicke and Soffa Investments, Inc., Wilmington, Del.

[21] Appl. No.: 792,801

[22] Filed: Nov. 15, 1991

[51] Int. Cl.⁵ .............................................. H01J 21/68
[52] U.S. Cl. .............................. 228/180.21; 228/102; 228/105
[58] Field of Search ...................... 228/6.2, 4.5, 180.2, 228/179, 102, 105; 266/162

[56] References Cited

U.S. PATENT DOCUMENTS

| | | | |
|---|---|---|---|
| 4,342,090 | 7/1982 | Caccoma et al. | 238/180.2 |
| 4,765,531 | 8/1988 | Ricketson et al. | 228/4.5 |
| 5,052,606 | 10/1991 | Cipolla et al. | 226/162 |
| 5,082,165 | 1/1992 | Ishizuka | 228/6.2 |
| 5,108,023 | 4/1992 | Japichino et al. | 228/6.2 |

Primary Examiner—Kenneth J. Ramsey
Attorney, Agent, or Firm—John B. Sowell

[57] ABSTRACT

Apparatus and a method for orienting individual bonding sites of a lead frame having a plurality of bonding sites includes a universal work station in a work holder. The work holder comprises a gripper mechanism which is mounted on a transverse rail or bar for grasping a lead frame at an edge portion thereof while exposed in a supply magazine. The jaws of the gripper mechanism are pivoted in a horizontal direction which permits the exposed edge of the lead frame to be aligned parallel to a reference plane in a theta orientation direction. While oriented in the theta orientation direction, the lead frame is moved precisely to the window of the work station of the work holder where it is clamped by the top plate and lower plate of the work station before being subsequently bonded. A modified feature of the invention permits the mechanically theta oriented bonding site to be viewed by a PRS system and reoriented in an X and Y position prior to being clamped in the work station to provide a very high degree of theta, X and Y location of individual bonding sites in the window of a work station prior to bonding.

5 Claims, 6 Drawing Sheets

SMART INDEXING HEAD FOR UNIVERSAL LEAD FRAME WORK STATION

BACKGROUND OF THE INVENTION

1. Field of the Invention

The present invention relates to work stations or work holders of the type employed in automatic wire bonders. More particularly, the present invention relates to indexing heads for automatically positioning the bonding sites of lead frames at the bonding station of automatic wire bonders.

2. Description of the Prior Art

The present invention is an improvement of prior art work stations or work holders of the type incorporated into automatic wire bonders made by Kulicke & Soffa Industries, Inc. of Willow Grove, Pa. under model designations 1482 and 1484. Such automatic wire bonders are commercially available and have heretofore employed dedicated work holders as well as quick change work holders.

Most modern automatic work holders and work stations employ automatic positioning and automatic clamping prior to automatic wire bonding for interconnecting the pads or electrodes on semiconductor chips to the leads of a lead frame when performing the critical bonding step of making packaged semiconductor devices.

The ability of modern automatic wire bonders to precisely locate the bonding tool at a predetermined X-Y far exceeds the precision with which a lead frame can be mechanically pre-positioned in a work holder. As more dense semiconductor chips are being designed for placement on lead frames, the electrode pads of the chips as well as the conductive fingers of the lead frames to which they are to be interconnected are becoming smaller and more difficult to locate precisely.

Prior art work stations such as that shown and described in U.S. Pat. No. 4,765,531 were provided with retractable tapered pins which were inserted into index holes in the lead frames as the lead frame was being prepositioned at the bonding station. After pre-positioning the lead frame it was still necessary to determine a precise and exact position of the pads or electrodes on the semiconductor chip and the fingers of the lead frame. This type work holder which used precisor pins would and will automatically locate the index holes on the lead frame relatively to the work station, however, the electrode pads on the chip and the conductive fingers on the lead frame may not be precisely located relative to the index holes on a lead frame due to the way the lead frame was manufactured. As an example, it is erroneously assumed that lead frames made by mass production methods have edges that are both straight and parallel. Most mass produced lead frames have curved edges in the shape of a sector taken from an annular ring. It has become the practice to define this deviation or curvature in mils of camber per designated length. For example, a lead frame may have one to three mils camber per 7" of length. A lead frame with this much error will preposition the bonding sites are varying positions when the edge is used as the reference point to locate a bonding site in the bonding station. When precisor pins are inserted into indexing holes that are exactly opposite the bonding site, the effect of camber is greatly diminished, but the lack of precision in locating the indexing holes relative to the electrode pads on the semiconductor chip and the conductive fingers of the lead frame remains a problem.

Accordingly it the purpose of the present invention to provide a novel work station capable of positioning each of a plurality of bonding sites on a lead frame in a work station with an equal degree of very high precision so as to enhance the ability of an automatic wire bonder to produce high yield wire bonded semiconductor devices.

SUMMARY OF THE INVENTION

It is a principal object of the present invention to provide a novel apparatus and method for accurately positioning lead frames at the work station of a work holder prior to performing a wire bonding operation.

It is another principal object of the present invention to provide a smart indexing head for accurately positioning a lead frame at the work station of a work holder.

It is another principal object of the present invention to provide a novel work holder having a novel indexing head which may be rapidly changed to process different sizes and lengths of lead frames with insignificant downtime.

It is another principal object of the present invention to provide a smart indexing head that locates, grasps, orients, indexes and repositions every bonding site of a lead frame at the bonding station of an automatic work holder.

It is another object of the present invention to provide a smart indexing head having a lead frame edge locating system.

It is another object of the present invention to provide a smart indexing head which is responsive to information generated by a pattern recognition system so as to reposition a lead frame prior to performing a bonding operation at the work station of a work holder.

It is a general object of the present invention to provide a smart indexing head capable of pre-positioning each lead frame site of a lead frame in a work station in an X and Y and theta orientation prior to a wire bonding operation.

According to these and other objects of the present invention, there is provided an automatic indexing work holder for an automatic bonding machine adapted to fit between input and output lead frame supply and receiving magazines. The work holder is provided with quick change elements comprising a pair of clamp plates which grasp the lead frame at the bonding site and expose the semiconductor device and lead fingers to be bonded in a Window area. A smart indexing head is movably mounted on guide rails of the work holder and is adapted to locate the X-Y edges of a lead frame in a supply magazine and to clamp the edges of the lead frame opposite a first bonding site to be bonded. Positioning means in the indexing head mechanism positions the lead frame in theta orientation and stepper motor means move the indexing head and the clamped lead frame to a predetermined position at the work station of the work holder where it is repositioned more accurately by the smart indexing head using information supplied by a pattern recognition system (PRS) before being clamped in the work station of the work holder prior to a conventional wire bonding operation. While the lead frame site clamped in the work station is being bonded, the smart indexing head releases the lead frame and moves upstream along the edge of the lead frame and again grasps the lead frame opposite the next bonding site to be wire bonded. When the work station releases the lead frame after a bonding operation, the smart indexing head again orients the grasped lead frame and transports it to the work station of the work holder to repeat the orientation steps before releasing control to the work holder.

DESCRIPTION OF THE PREFERRED EMBODIMENT

Figure 1:
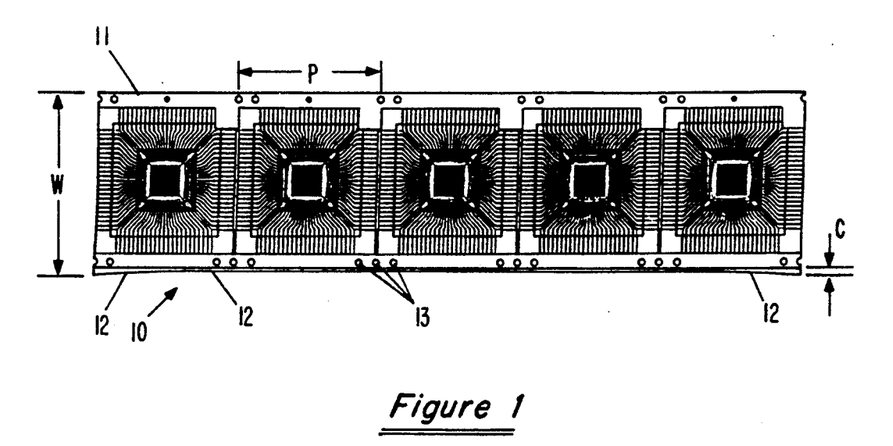
FIG. 1 is a plan view of a typical 7" lead frame having five bonding sites.

Refer now to FIG. 1 showing a typical lead frame having an upper straight edge 11 and a lower curved edge 12. The amount of curvature or camber is shown as a deviation C and each of the bonding sites has a pitch P and a width W. Lead frames may vary from under five inches to ten inches and the width is usually a function of the number of leads or lead count of the device which is attached to the die pad at the center of the bonding site. Indexing holes 13 are provided between bonding sites. The electrode pads of the semiconductor device are interconnected to the lead fingers which have a width of approximately 3 mils to 5 mils. The problem that exists in the art today is that lead frames are made by different processes and by different manufacturers, thus, include in their inherent process of manufacturer different types of errors. It is possible that when producing the identical semiconductor device, the lead frames of several different manufacturers will be intermingled. Thus it is necessary that the work station and indexing mechanism be capable of handling different lead frames from different manufacturers with different types of manufacturers errors.

Figure 2:
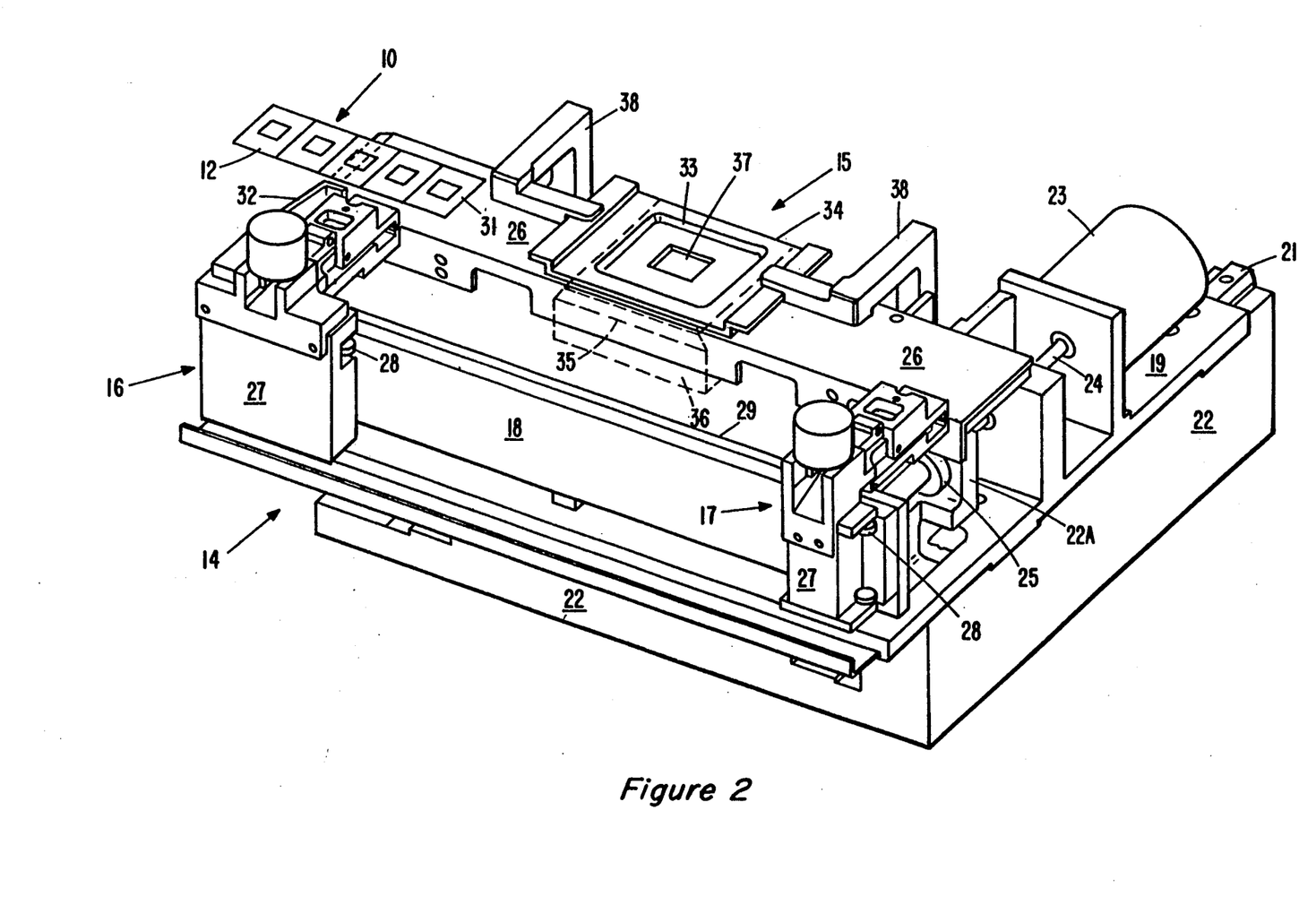
FIG. 2 is a frontal isometric view of the work holder showing the major components including two smart indexing heads mounted on a movable table.

Refer now to FIG. 2 showing a work holder 14 having a work station 15 for receiving the aforementioned lead frames 10. There is shown a master indexing head 16 and a slave indexing head 17 mounted on a horizontal rail 18 which are independently movable and controllable to grasp a lead frame and move it to or from the work station 15.

Work station 15 is fixed to the base 22. A table 19 is movably mounted in the Y direction on a pair of rails 21 fixed on base 22. Table 19 is movable by motor 23 having a shaft 24 with a lead screw thereon which fits into a threaded nut 25 in arm 22A of base 22. Thus, when motor 23 rotates its screw in nut 25, the whole table 19 on which the indexing heads 16 and 17 and rail 18 are mounted move in the Y direction. As will be explained in greater detail hereinafter, a lead frame 10 is presented to the platform 26 by a supply magazine (not shown). The lead frame 10 physically rests on the platform 26 with its lower edge 12 exposed in front of platform 26 so as to be grasped by the jaw arms and jaws of the indexing heads 16, 17 which will be explained in greater detail hereinafter.

The indexing head 16 preferably comprises a linear stepper motor of the type made by Northern Magnetics, of Van Nuys, Calif. and comprises an X motor 27 having a plurality of guide rollers 28 which maintain precision tracking on the rail armature 18 which is mounted on a beam 29 of the Y table 19.

In the preferred mode of operation, a lead frame 10 is presented by the indexing mechanism of the magazine to the platform 26 and a portion is retained in the magazine. The indexing head 16 moves to the left and senses an edge 31 and the lower edge 12 employing sensor 32 (shown in FIG. 5) to determine the exact location of the edges 31 and 12. Once the edges are located by the indexing head 16, it is possible for the indexing head to grasp a portion of the edge 12 opposite a bonding site and move the lead frame and its bonding site to the work station 15. When the bonding site is precisely located in the window 33 of the work station 15, the PRS system is employed to determine the exact location of the lead frame bonding site. The information obtained by the PRS system is employed to move the indexing head 16 in the X direction and to move the Y table 19 in the Y direction to reposition the bonding site of the lead frame in the window 33 prior to clamping the lead frame between the removable upper clamp plate 34 and the removable lower clamp plate 35 which is attached to a vertically movable heat block 36. The removable lower clamp plate 35 is shown having a die pad recess 37 which permits the lead frame 10 to lie flat on the removable lower clamp plate 35. It will be understood that the clamp support frame 38 which holds the removable top clamp plate 34 is physically connected to the base 22 and does not move with the table 19. As will be explained hereinafter, clamp frame members 38 move vertically downward during a clamping operation and at the same time the heat block 36 with the removable lower clamp plate thereon moves vertically upwards so as to clamp the lead frame 10 in the correct position for a bonding operation.

Figure 3:
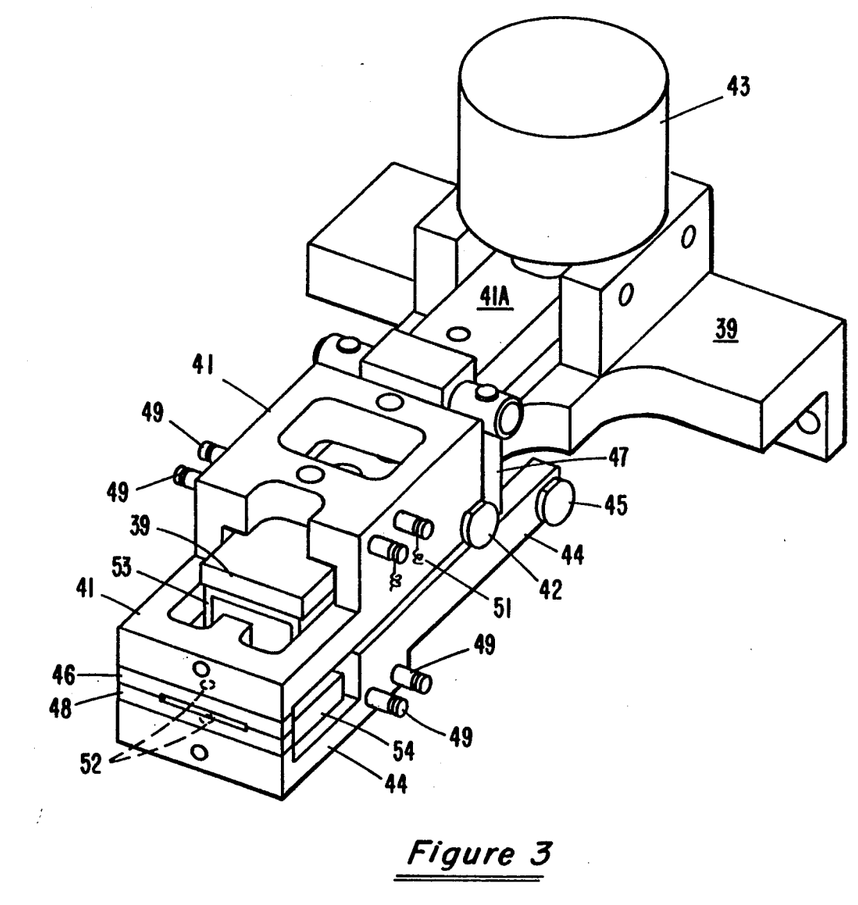
FIG. 3 is an enlarged left side isometric view of a smart indexing head showing the lead frame gripping jaws from the front.

Refer now to FIG. 3 showing an enlarged left side isometric view of the indexing head 16 showing a support arm 39 adapted to be connected to the X motor 27. The support arm 39 provides means for supporting the upper and lower jaw arms 41 and 44. Upper jaw arm 41 is shown pivoted on the support arm 39 at pivot 42. The lower jaw arm 44 is shown pivoted on the support arm 39 at pivot 45. Actuation of the upper and lower jar arms 41 and 44 is performed by linear actuator 43 cooperating with the rearward extension 41A of upper jaw arm 41. Upward movement of the arm extension 41A causes downward movement of the upper jaw insert 46. Upward movement of arm 41A also causes upward movement of adjustable actuator pins 47 which engage the top of lower jaw arm 44. Thus upward movement of arm 41A causes upward movement of lower jaw 44 and lower jaw insert 48. Upper jaw arm 41 and lower jaw arm 44 are urged or biased toward each other by springs 51 connected to spring hanger pins 49. The jaw inserts 46 and 48 pivot universally about ball socket points 52 in their respective upper and lower jaw arms 41 and 44 as will be explained in greater detail hereinafter. Also to be explained in more detail hereinafter is the operation of the linear slider 53 which is mounted on the forward extension of support arm 39 and provides means for guiding the theta bar 54 which cooperates with the upper and lower jaw inserts 46 and 48.

Figure 4:
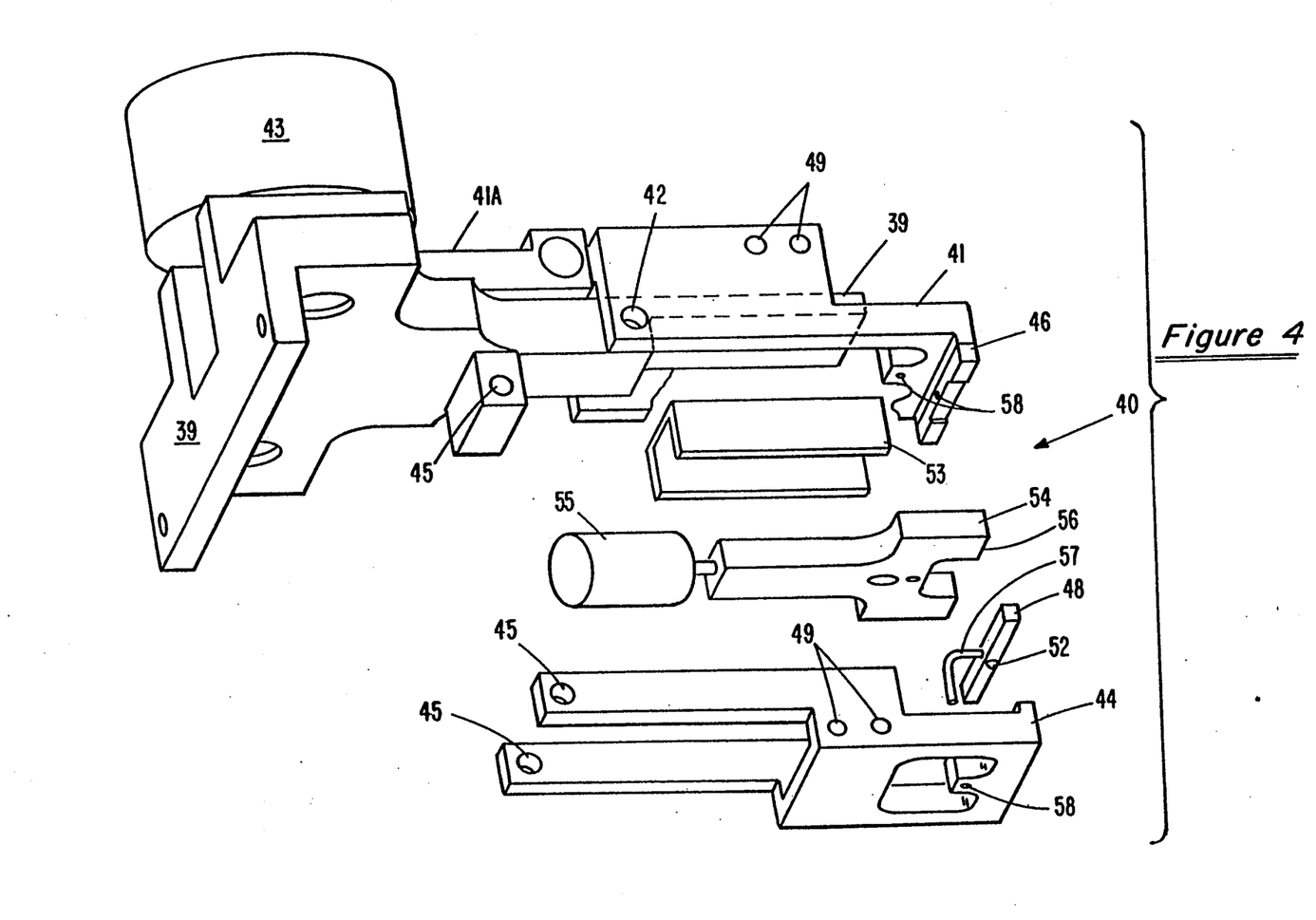
FIG. 4 is an enlarged right side exploded isometric view of the support arm of an indexing head and the jaw arms pivoted thereon showing how the theta bar is slidably mounted on the support arm.

Refer now to FIG. 4 showing an enlarged right side exploded isometric view of the support arm 39 and the jaw arms 41 and 44 showing the theta bar 54 slidably mounted in the linear slider 53 which is supported on the support arm 39. As explained hereinbefore when the linear actuator 49 mounted on support arm 39 move up the rearward portion of the upper jaw arm 41 at portion 41A move up causing the forward portion of the upper jaw arm 41 to move downward carrying the upper jaw insert 46. The same actuation movement by linear actuator 43 causes the lower jaw arm 44 to move upward carrying its lower jaw insert 48 upward to perform a grasping operation inside the edge 12 of the lead frame 10 leaving the inner most edge 12 exposed inside of the jaws 46 and 48. The exposed edge 12 of the lead frame 10 is then engaged by the theta bar 54 actuated by a linear actuator 55 so as to engage the front most face or reference plane 56 against the edge 12 of the lead frame 10, thus, positioning it orthogonal to the direction of the movement of the theta bar 54. It will be understood that as each bonding site of the lead frame 10 is grasped by the jaw mechanism 40, it is subsequently oriented in the theta direction by engagement of the reference plane 56 with the exposed edge 12 of the lead frame 10. It will be understood that the theta bar 54 and its reference plane 56 stays engaged against the edge 12 of the lead frame opposite the bonding site to be bonded until such time as it is correctly positioned and clamped by the top clamp plate 34 and lower clamp plate 35 of the work station 15. The upper and lower jaw inserts 46 and 48 are shown in FIG. 4 being pivotally mounted by ball socket points 52 in their respective upper and lower jaw arms 41 and 44 and are held in this floating position by retainer springs 57 which connect into pin inserts 58 of the jaw arms. The linear slider 53 in FIG. 4 is provided with a roller and ball slider cage mechanism (not shown).

Figure 5:
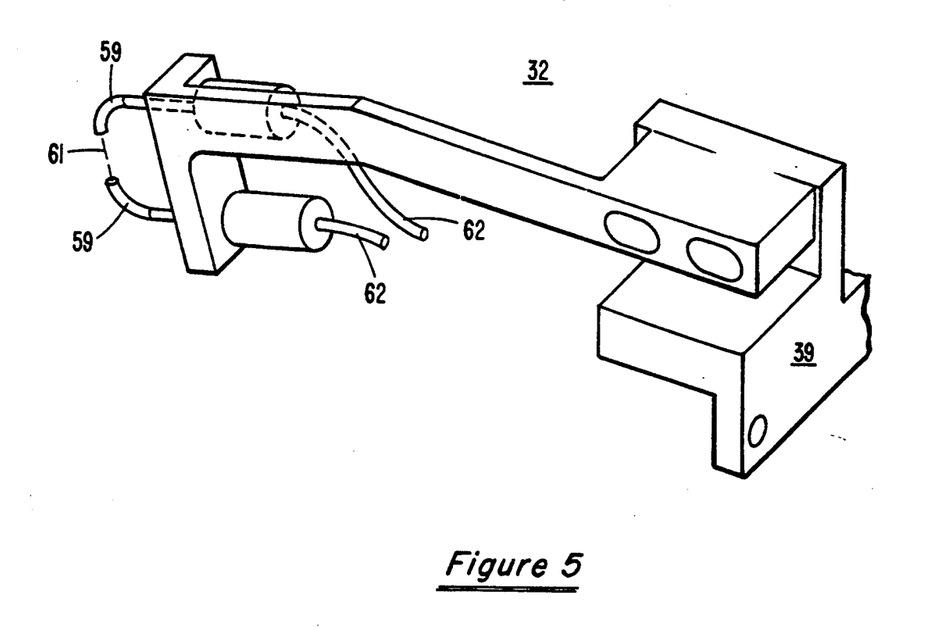
FIG. 5 is an enlarged left side isometric view of a preferred lead frame position sensor.

Refer now to FIG. 5 showing an enlarged left side isometric view of a preferred lead frame positioning sensor 32. The sensor mechanism 32 is mounted on the upper support arm 39 of the indexing head 16. The forward portion of the sensor 32 provides support means for a pair of fiber optic cables 62 which extend through fiber optic connectors 59 to provide a optical or light path 61 therebetween. Thus, interruption of the path 61 by either the lower edge 12 or a leading edge 31 will supply sufficient X-Y information to permit the indexing head 16 and its jaw mechanism 40 to be located exactly opposite any one of the bonding sites of the lead frame 10. In a preferred mode of operation the sensor 32 only locates the edge 31 of the lead frame 10 during its initial positioning of the right most bonding site of the lead frame 10. Subsequent positions of the gripping mechanism 40 already know the X position because the lead frame is positioned in the work station 15. However, when the gripping mechanism 40 is moved to the left in FIG. 2 to grasp a new portion of the lead frame at the edge 12, the sensor 32 is always used to locate the edge 12 to eliminate any of the errors introduced by the aforementioned camber or deviations in the lead frame due to manufacture.

Figure 6:
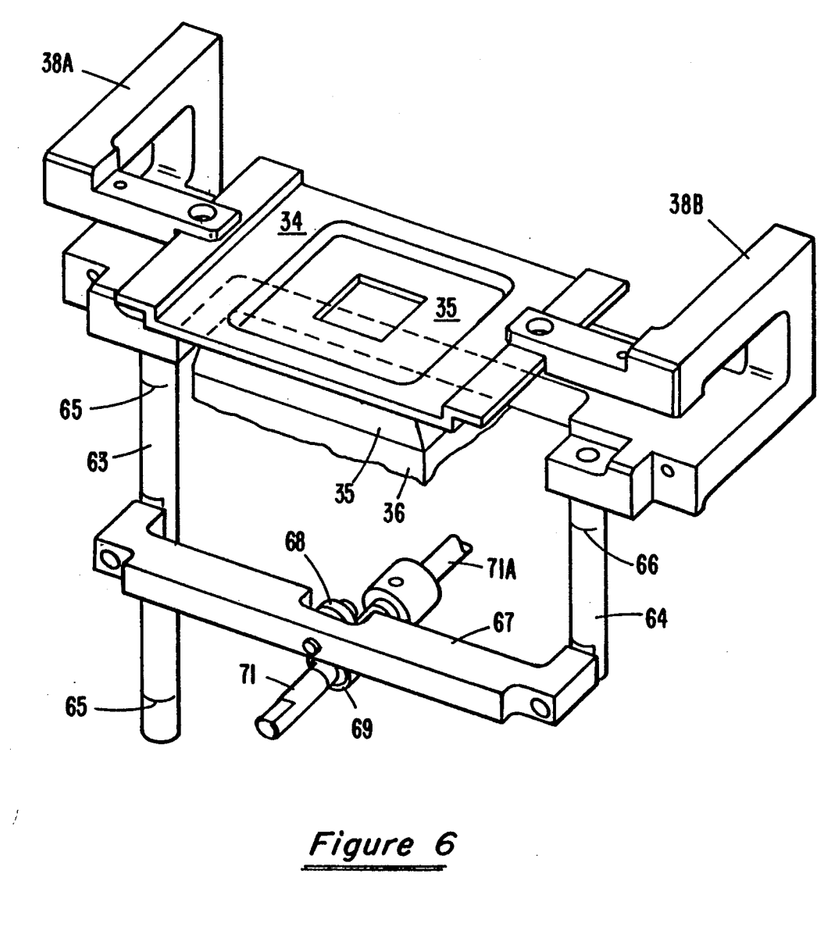
FIG. 6 is an enlarged isometric view of the quick change work holder and actuating mechanism.

Refer now to FIG. 6 showing an enlarged isometric view of the quick change work station 15 and its actuating mechanism which causes a clamping operation of the top clamp plate and lower clamp plates 34 and 35. Clamp frame member 38B is shown rigidly connected to a guide shaft 63 and clamp frame member 38B is shown rigidly connected to a guide shaft 64. Guide shaft 63 is vertically guided and positioned by precision linear bearings which engage the guide shaft 63 at two bearing points 65. The linear bearings (not shown) are precisely located in base 22 and are not movable by the table 19. A self aligning bearing in base 22 surrounds the guide shaft 64 at self aligning bearing point 66. A transverse frame member 67 connects to the guide shafts 63 and 64 forming a rigid hollow frame member therewith. The transverse frame member 67 has a roller follower 68 pivotally mounted thereon which is engagable by a vertical actuating cam 69 mounted on actuator shaft 71. A rear portion of shaft 71A is provided with a second actuating cam (not shown) which engages the vertical movable heat block 36 to cause upward movement of heat block 36 when downward movement of transverse member 67 and top clamp plate 34 occur. Thus, it will be understood that the top plate 34 and the lower clamp plate 35 move toward or away from each other at equal speeds in a clamping operation to clamp a bonding site in the work station 15 prior to a bonding operation. Further, it will be understood that the work station 15 has no relative X or Y movement but only moves in the Z direction. In contrast thereto, the lead frame 10 clamped by the jaws 46 and 48 of the gripping mechanism may be moved in the X direction by the X motor 27 of the indexing head 16 and moved in the Y direction by Y motor 23 which moves the Y table 19. Effectively the indexing mechanism positions a lead frame in X, Y and theta prior to the clamping operation of the work station 15.

Figure 7:
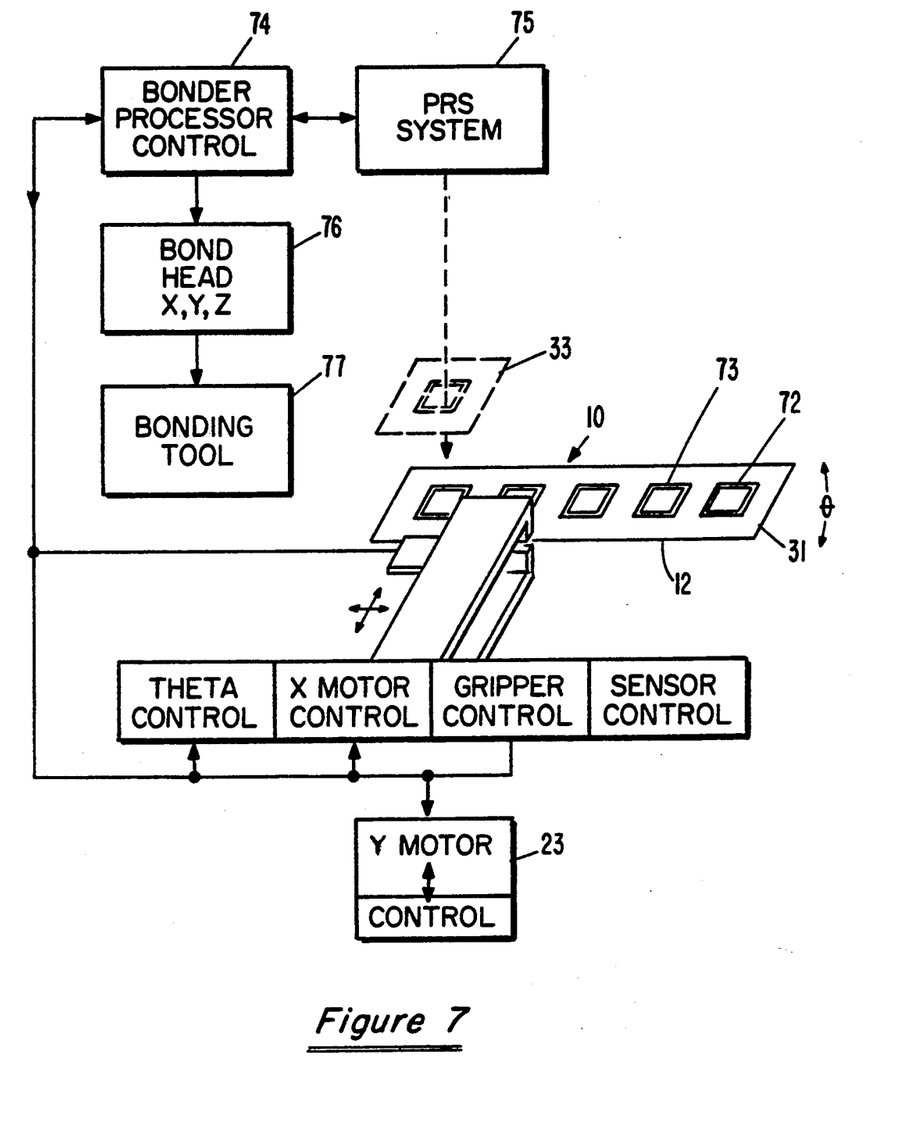
FIG. 7 is a schematic block diagram showing the controls and PRS system which are employed to position a bonding site of a lead frame in the bonding window of a work station.

Refer now to FIG. 7 showing a schematic block diagram of the controls and pattern recognition system (PRS) which are employed to position a lead frame bonding site in the bonding window 33 of the work station 15. In the preferred mode of operation, the indexing head 16 comprising the gripping mechanism of FIG. 3 and sensor 32 is positioned to the right of a lead frame 10 which extends from a feed magazine (not shown). The indexing head is moved to the left until it senses the edge 31 of the lead frame 10 as shown in FIG. 2. The sensor and indexing head is then moved to a position where it may be moved in a direction to sense the lower edge 12 of the lead frame 10. This information is supplied to the bonding processor control 74 which issues commands to the X motor 27 and Y motor 23 so as to position the jaws 46 and 48 of the gripping mechanism opposite a first bonding site 72. As explained hereinbefore the gripping mechanism leaves the lower or inner edge of the motor 10,;exposed to the theta bar 54 which is actuated after the linear actuator 43 causes the clamping operation. The bonding processor control 74 then issues commands to the X motor 27 which causes the X motor to position the first bond site 72 in the window 33 of the work station 15. The PRS system 75 is then employed to determine the exact position of the bonding site 72 in the window 33. The lead frame is still held by the gripping mechanism and is not yet clamped by the work station 15. The lead frame is repositioned by the PRS system and the bonding processor control 74 to an accuracy of at least ±1 mil. At this point in time, the lead frame is clamped by the top clamp plate 34 and lower clamp plate 35 employing the actuating mechanism shown in FIG. 6 after being repositioned. The accuracy of the theta positioning mechanism of the gripping mechanism is sufficient that no theta repositioning is required. While the automatic wire bonder is performing a bonding operation on the bonding site 72, the gripping mechanism releases the lead frame 10 at the bonding site 72 and repositions itself using its sensor 32 opposite the bonding site 73. After completion of the bonding operation, the work station and its actuation mechanism releases the clamping operating of the lead frame 10 which is now gripped by the gripping mechanism at the second bonding site 73. The gripping mechanism and its X motor and theta bar actuator are actuated. The lead frame 10 is moved in theta oriented simultaneously while being placed or position in the window 33 opposite the second bonding site 73. Again the PRS system 75 in conjunction with the bonding processor controller 74 verifies the X-Y position of the second bonding site 73 and repositions the second bonding site in both X and Y before being clamped by the top and lower clamp plates 34 and 35 of the work station 15 prior to a conventional automatic wire bonding operation.

It will be understood that a conventional wire bonding operation employs a PRS system of the type shown and described in U.S. Pat. No. 4,853,968 which is capable of determining the position of the electrode pads on the semiconductor device and the fingers of the lead frames to an accuracy of a fraction of a pixel of the video cameras employed in the PRS system. This accuracy is always greater than the ability to position the bond head 76 and its bonding tool 77 in an X, Y and Z position.

Having explained a preferred embodiment of the present invention, it will be understood that various widths of lead frames having various pitches and overall lengths may be accommodated by the universal lead frame work station shown in FIG. 2. It is only necessary to program the width and pitch of a lead frame and the number of bonding sites in order to change from one lead frame to another. If the information on the bonding site is already stored in memory of the processor controller 74 it is not even necessary to reteach the automatic wire bonder. The information needed to perform a bonding operation. In the preferred embodiment of the present invention, the slave indexing head 17 is only employed to grasp the frame 10 when it is positioned at its last bonding site in the work station 15 and to move it along platform 26 a distance sufficient to insert it into the receiving magazine mounted on the automatic wire bonder (not shown). When different size lead frames having different size bonding sites are to be bonded it is possible to rapidly replace the removable top plate clamp and lower clamp plate 34 and 35 and proceed with an automatic bonding operation. A feature of the present invention is that the platform 26 is heated along its entire length at both prebond and postbond positions, that is, both sides of the work station 15. This enables the lead frame 10 to be uniformly preheated and uniformly postheated or cooled to prevent warping and distortion as occurs when the heat is only applied by the heat block 36 at the work station 15.

Having explained the preferred embodiment apparatus for positioning a bonding site of a lead frame in a bonding window of a work station is should now be apparent to those skilled in this art that the preferred structure could be modified to change the simple and reliable pivotable jaw arms and retain the function of positioning the edge of a lead frame in a theta direction.

What is claimed is:

1. A method for pre-positioning each individual bonding site of a lead frame of the type having a plurality of bonding sites in a bonding window of a work station of an automatic bonding machine prior to performing an automatic bonding operation, comprising the steps of:

sensing the edge portions of a lead frame exposed in a supply magazine, grasping a portion of the lead frame exactly opposite the bonding site to be pre-positioned in a gripping mechanism, mechanically orienting said lead frame in a theta direction to align the edge of said lead frame exactly opposite said bonding site parallel to a reference plane, holding the rotated lead frame in said gripping mechanism, and transporting said mechanically rotated lead frame to the bonding window of the work station of said automatic wire bonder in a pre-position theta orientation.

2. A method as set forth in claim 1 which further includes the step of determining the precise X and Y position of said bonding site in said window of said bonding station, and post-positioning said bonding site in said bonding window prior to clamping said bonding site in said work station before performing a bonding operation.

3. A method as set forth in claim 2 wherein the step of determining the precise X and Y position of said bonding site is performed by a pattern recognition system incorporated into said automatic wire bonding machine.

4. A method as set forth in claim 3 which further includes the step of clamping said bonding site in said work station of said automatic wire bonding machine and releasing said gripping mechanism, moving said gripping mechanism to a next portion of said lead frame exactly opposite the next bonding site to be pre-positioned, and grasping said next portion of said lead frame before releasing the lead frame clamped in said work station.

5. A method as set forth in claim 4 which further includes the step of releasing said lead frame clamped in said work station and then repeating the steps of mechanically rotating said lead frame in a theta direction to align the edges of said next bonding site of said lead frame parallel to a reference plane.

* * * * *